(12) United States Patent
Ikemoto

(10) Patent No.: US 11,956,903 B2
(45) Date of Patent: Apr. 9, 2024

(54) TRANSMISSION LINE, METHOD OF MANUFACTURING TRANSMISSION LINE, AND ELECTRONIC APPARATUS

(71) Applicant: Murata Manufacturing Co., Ltd., Nagaokakyo (JP)

(72) Inventor: Nobuo Ikemoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 223 days.

(21) Appl. No.: 17/715,987

(22) Filed: Apr. 8, 2022

(65) Prior Publication Data
US 2022/0232708 A1 Jul. 21, 2022

Related U.S. Application Data

(63) Continuation of application No. PCT/JP2020/041422, filed on Nov. 5, 2020.

(30) Foreign Application Priority Data

Nov. 15, 2019 (JP) .................................. 2019-206607
Mar. 30, 2020 (JP) .................................. 2020-059348

(51) Int. Cl.
*H05K 3/46* (2006.01)
*H05K 1/14* (2006.01)

(52) U.S. Cl.
CPC .............. *H05K 3/46* (2013.01); *H05K 1/141* (2013.01)

(58) Field of Classification Search
CPC .................................. H05K 3/46; H05K 1/141
(Continued)

(56) References Cited

U.S. PATENT DOCUMENTS 5,365,203 A 11/1994 Nakamura et al.
2006/0288570 A1 12/2006 Cannon et al.
(Continued)

FOREIGN PATENT DOCUMENTS

JP 06-152208 A 5/1994
JP 2007-150526 A 6/2007
(Continued)

OTHER PUBLICATIONS

Official Communication issued in International Patent Application No. PCT/JP2020/041422, dated Dec. 28, 2020.

*Primary Examiner* — Andargie M Aychillhum
(74) *Attorney, Agent, or Firm* — Keating & Bennett, LLP

(57) ABSTRACT

A transmission line includes a first structure including a first flexible resin base material, and a first ground conductor thereon, a second structure including a second flexible resin base material, and a first signal line and an interlayer connection conductor in or on the second resin base material, a first spacer between the first and second structures, and a first metal joining material joining the first and second structures with the first spacer interposed therebetween. A first hollow portion is between the first and second structures with the first spacer interposed therebetween. The first signal line and the first ground conductor face each other in a joining direction with the first hollow portion interposed therebetween. The first resin base material and the second resin base material are not in contact with each other. The first metal joining material has a melting point lower than that of the interlayer connection conductor.

27 Claims, 15 Drawing Sheets

(58) Field of Classification Search
USPC .......................................................... 174/261
See application file for complete search history.

(56) References Cited

U.S. PATENT DOCUMENTS

| | | |
|---|---|---|
| 2008/0315977 A1 | 12/2008 | Green et al. |
| 2014/0158406 A1* | 6/2014 | Kato ...................... H05K 1/024 |
| | | 174/250 |
| 2014/0159836 A1 | 6/2014 | O'Neil et al. |
| 2017/0062889 A1 | 3/2017 | Lee et al. |
| 2018/0309182 A1 | 10/2018 | Iida et al. |
| 2021/0288390 A1* | 9/2021 | Tago ...................... H01P 5/028 |

FOREIGN PATENT DOCUMENTS

| | | |
|---|---|---|
| JP | 2009-094752 A | 4/2009 |
| JP | 2011-160231 A | 8/2011 |
| JP | 2011-182311 A | 9/2011 |
| JP | 2013-126029 A | 6/2013 |
| JP | 2018-534804 A | 11/2018 |
| WO | 2017/130731 A1 | 8/2017 |

* cited by examiner

TRANSMISSION LINE, METHOD OF MANUFACTURING TRANSMISSION LINE, AND ELECTRONIC APPARATUS

CROSS REFERENCE TO RELATED APPLICATIONS

This application claims the benefit of priority to Japanese Patent Application No. 2019-206607 filed on Nov. 15, 2019 and Japanese Patent Application No. 2020-059348 filed on Mar. 30, 2020, and is a Continuation Applications of PCT Application No. PCT/JP2020/041422 filed on Nov. 5, 2020. The entire contents of each application are hereby incorporated herein by reference.

BACKGROUND OF THE INVENTION

1. Field of the Invention

The present invention relates to a transmission line for transmitting a high-frequency signal, a method of manufacturing a transmission line, and an electronic apparatus.

2. Description of the Related Art

As a transmission line according to the related art, for example, a signal transmission line is disclosed in International Publication No. 2017/130731. The signal transmission line includes a laminate having a hollow portion, a signal conductor, a plurality of ground conductors, and an interlayer connection conductor. The laminate is formed by laminating resin base materials. The signal conductor, the ground conductors, and the interlayer connection conductor are formed in the laminate. The signal conductor is disposed so as to be exposed to the hollow portion. The ground conductors are electrically connected by the interlayer connection conductor.

SUMMARY OF THE INVENTION

In the signal transmission line disclosed in International Publication No. 2017/130731, resin base materials formed with predetermined conductors are laminated and hot-pressed to join the resin base materials together and join the conductors together. Further, the hollow portion is formed by joining the resin base materials to each other. In this case, in the above laminating and hot-pressing processes, it is difficult to join the resin base materials together and join the conductors together, while ensuring a distance between a signal line and the ground conductor. Accordingly, the distance between the signal line and the ground conductor varies, and variations easily occur in transmission characteristics of the signal transmission line.

Preferred embodiments of the present invention provide methods of manufacturing transmission lines each having a hollow structure in which variations in transmission characteristics are reduced, and also provide electronic apparatuses.

A transmission line according to a preferred embodiment of the present invention includes a first structure including a first resin base material having flexibility, and a first ground conductor on the first resin base material, a second structure including a second resin base material having flexibility, and a first signal line and an interlayer connection conductor in or on the second resin base material, a first spacer between the first structure and the second structure, and a first metal joining material to join the first structure and the second structure with the first spacer interposed therebetween, wherein a first hollow portion is between the first structure and the second structure joined to each other with the first spacer interposed therebetween, the first signal line and the first ground conductor face each other in a joining direction with the first hollow portion interposed therebetween, the first resin base material and the second resin base material are not in contact with each other, and the first metal joining material has a melting point lower than that of the interlayer connection conductor.

A method of manufacturing a transmission line according to a preferred embodiment of the present invention includes forming a first structure by forming a first ground conductor on a first resin base material having flexibility, forming a second structure by forming a first signal line, and an interlayer connection conductor in or on a second resin base material having flexibility, and joining the first structure and the second structure by a metal joining material with a spacer interposed therebetween such that the first signal line and the first ground conductor face each other with a hollow portion interposed therebetween, wherein in the joining the first structure and the second structure, the first resin base material and the second resin base material are not in contact with each other, and the metal joining material has a melting point lower than that of the interlayer connection conductor.

According to preferred embodiments of the present invention, variations in transmission characteristics of a transmission line having a hollow structure can be reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described. Each preferred embodiment is an example, and it is possible to partially replace or combine configurations illustrated in different preferred embodiments. In each preferred embodiment, points different from points described before the preferred embodiments will be described. In particular, similar effects due to a similar configuration will not be repeatedly described for each preferred embodiment.

First Preferred Embodiment

Figure 1:
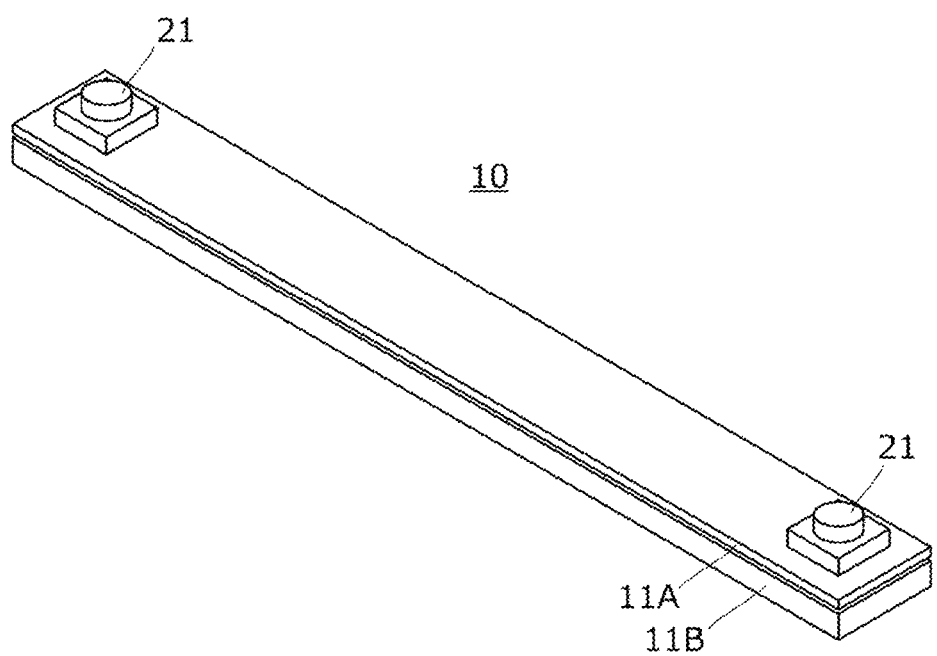
FIG. 1 is an external perspective view of a transmission line 10 according to a first preferred embodiment of the present invention.
Figure 2:
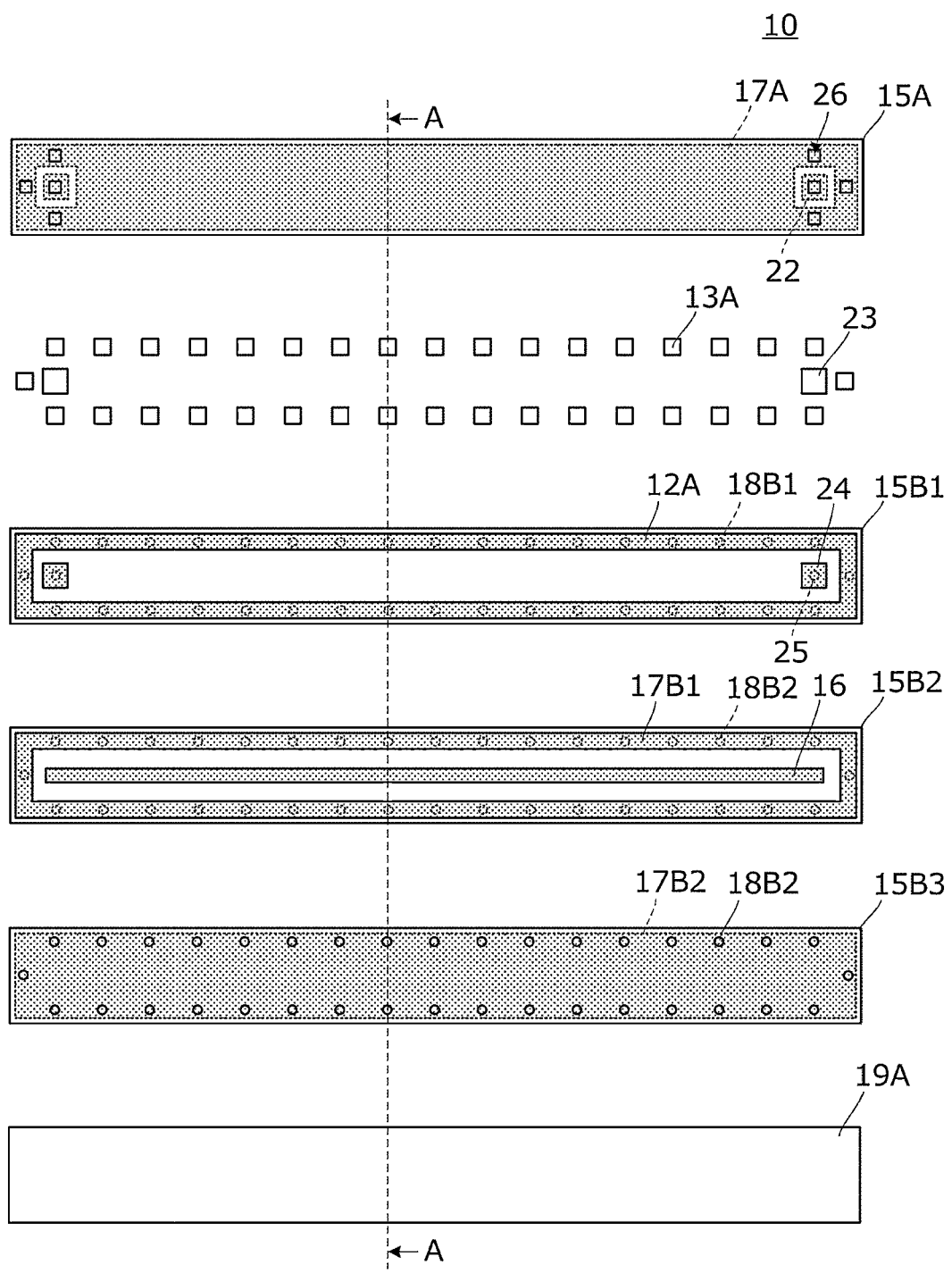
FIG. 2 is a plan view of each layer of the transmission line 10.
Figure 3:
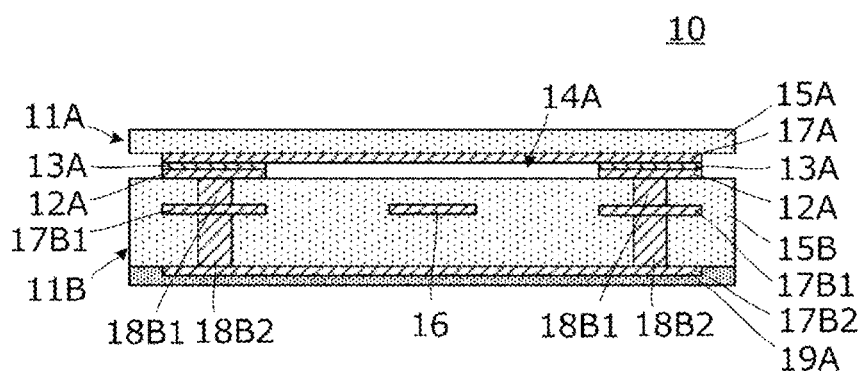
FIG. 3 is a sectional view of the transmission line 10 taken along line A-A.

FIG. 1 is an external perspective view of a transmission line 10 according to a first preferred embodiment of the present invention. FIG. 2 is a plan view of each layer of the transmission line 10. FIG. 3 is a sectional view of the transmission line 10 taken along line A-A.

As illustrated in FIG. 1 and FIG. 2, the transmission line 10 includes structures 11A and 11B, a joining electrode 12A, a first metal joining material 13A, and a connector 21. The structure 11A is an example of a "first structure". The structure 11B is an example of a "second structure". The structures 11A and 11B each have a planar shape, and extend in one direction. The structure 11A and the structure 11B are laminated such that respective longitudinal directions coincide with each other. The connectors 21 are provided on an upper surface of the structure 11A at respective ends in the longitudinal direction of the structure 11A.

Note that, in the present specification, the terms "upper surface" and "lower surface" are used for convenience to distinguish a main surface on one side from a main surface on another side. Similarly, terms "upper side" and "lower side" are used for convenience to distinguish one side from another side.

As illustrated in FIG. 2 and FIG. 3, the structure 11A and the structure 11B are joined to each other with a metal joining material 13A with a joining electrode 12A forming a spacer interposed therebetween. The joining electrode 12A is an example of a "first spacer". The metal joining material 13A is an example of a "first metal joining material". A hollow portion 14A is located between the structure 11A and the structure 11B, by joining the structure 11A and the structure 11B with the joining electrode 12A interposed therebetween. The hollow portion 14A is an example of a "first hollow portion".

The structure 11A includes a resin base material 15A and a ground conductor 17A. The resin base material 15A is an example of a "first resin base material". The ground conductor 17A is an example of a "first ground conductor". The structure 11B includes a resin base material 15B, a signal line 16, ground conductors 17B1 and 17B2, and interlayer connection conductors 18B1 and 18B2. The resin base material 15B is an example of a "second resin base material". The ground conductors 17B1 and 17B2 are examples of a "second ground conductor". The signal line 16 and the ground conductor 17A face each other in a joining direction (a direction in which the structure 11A and the structure 11B are joined to each other) with the hollow portion 14A interposed therebetween. The resin base material 15A and the resin base material 15B are not in contact with each other.

The resin base materials 15A and 15B each have flexibility, and contain, for example, a liquid crystal polymer (LCP) as a main component. The resin base material 15B includes integrated resin layers 15B1, 15B2, and 15B3. The resin layers 15B1, 15B2, and 15B3 are disposed in this order from an upper side to a lower side.

Note that, the resin base material 15A of the structure 11A may have a plurality of resin layers, similarly to the resin base material 15B of the structure 11B.

The resin base materials 15A and 15B are formed of materials of the same kind. Accordingly, the structures 11A and 11B can be integrated with each other in a state in which distortion due to a difference in physical properties between the resin base materials 15A and 15B is less likely to occur.

The resin base material 15A and the resin base material 15B may be formed of materials having characteristics different from each other. For example, the resin base material 15A disposed on an outer side of the transmission line 10 may be formed of a material having excellent weather resistance (environmental resistance) or mechanical properties. Weather resistance is a property with which deformation, alteration, deterioration, and the like against changes in temperature, humidity, and the like are less likely to occur. Mechanical properties include strength such as bending strength, hardness, toughness, and the like. The resin base material 15B disposed inside the transmission line 10 may be formed of a material for which importance is placed on electrical characteristics. For example, when characteristic impedance of the transmission line 10 is set to a desired value, by forming the resin base material 15B with a material having a low relative dielectric constant, a line width of the signal line 16 can be increased, thus reducing a conductor loss caused in the signal line 16. Alternatively, the resin base material 15A and the resin base material 15B may be formed of materials having different hues, respectively. This makes it easy to identify the base materials by image recognition in a process of manufacturing the transmission line 10.

The joining electrode 12A is located on an upper surface of the resin layer 15B1. The joining electrode 12A is disposed between the structure 11A and the structure 11B. The joining electrode 12A includes a conductor made of the same material as that of a conductor defining the signal line 16. The joining electrode 12A may include a conductor thicker than the conductor defining the signal line 16, in order to realize a predetermined thickness of the hollow portion 14A. The joining electrode 12A extends in a longitudinal direction of the structure 11B at both ends in a width direction of the structure 11B. The ground conductor 17A is located on substantially an entire lower surface of the resin base material 15A. The signal line 16, the ground conductors 17B1 and 17B2, and the interlayer connection conductors 18B1 and 18B2 are formed in the resin base material 15B. The signal line 16 and the ground conductor 17B1 are disposed on an upper surface of the resin layer 15B2. The signal line 16 extends in the longitudinal direction of the structure 11B at a center in the width direction of the structure 11B. The ground conductor 17B1 extends in the longitudinal direction of the structure 11B at both ends in the width direction of the structure 11B. The ground conductor 17B2 is disposed on substantially an entire lower surface of the resin layer 15B3. The joining electrode 12A, the signal line 16, and the ground conductors 17B1 and 17B2 are conductor patterns formed of, for example, Cu foil.

Note that, instead of extending in the longitudinal direction of the structure 11B, the joining electrodes 12A and the ground conductors 17B1 may be disposed at intervals along the longitudinal direction of the structure 11B.

Further, a plurality of the signal lines 16 may be provided. In this case, in order to ensure isolation among the signal lines 16, a ground conductor and an interlayer connection conductor may be provided between the signal lines 16.

The signal line 16 and the ground conductor 17A face each other with the resin base material 15B, in addition to the hollow portion 14A, interposed therebetween. However, the signal line 16 and the ground conductor 17A may face each other with at least one of the hollow portion 14A and the resin base materials 15A and 15B, interposed therebetween by appropriately changing the disposition of the signal line 16, the ground conductor 17A, and the like.

The joining electrode 12A is joined to and electrically connected to the ground conductor 17B1 with the interlayer connection conductor 18B1 interposed therebetween. The ground conductor 17B1 is joined to and electrically connected to the ground conductor 17B2 with the interlayer connection conductor 18B2 interposed therebetween.

The metal joining materials 13A are disposed at intervals along a longitudinal direction of the transmission line 10, at both ends in a width direction of the transmission line 10. The metal joining material 13A joins and electrically connects the joining electrode 12A and the ground conductor 17A to each other. Accordingly, the metal joining material 13A joins the structure 11A and the structure 11B to each other with the joining electrode 12A defining a spacer interposed therebetween. The metal joining material 13A is made of a material having a melting point lower than those of the interlayer connection conductors 18B1 and 18B2. For example, the metal joining material 13A is made of solder, and the interlayer connection conductors 18B1 and 18B2 are made of a Cu—Sn alloy. Note that, the interlayer connection conductors 18B1 and 18B2 need not overlap with the metal joining material 13A, when viewed in a top-bottom direction.

The hollow portion 14A is defined by the structures 11A and 11B, the joining electrode 12A, and the first metal joining material 13 as described above, and extends in the longitudinal direction of the transmission line 10. The hollow portion 14A is surrounded by a lower surface of the ground conductor 17A, an upper surface of the resin base material 15B, and an end surface inside the joining electrode 12A. As described above, the hollow portion 14A is between the signal line 16 and the ground conductor 17A. Accordingly, generation of a dielectric loss is reduced or prevented, so that a transmission loss of the transmission line 10 is reduced. Further, when the characteristic impedance of the transmission line 10 is set to a desired value, the line width of the signal line 16 can be increased, thus reducing a conductor loss caused in the signal line 16.

A protection layer 19A is provided on a lower surface of the resin base material 15B. The protection layer 19A is disposed on an entirety of the lower surface of the resin base material 15B so as to cover the ground conductor 17B2.

Note that, a conductive protection film made of Ni/Au or the like having excellent oxidation resistance may be provided, for example, by plating, on a surface of the joining electrode 12A and the ground conductor 17A exposed to the hollow portion 14A, or to an outside of the transmission line 10.

Mounting electrodes 22 are provided on a lower surface side of the resin base material 15A at both ends in a longitudinal direction of the resin base material 15A. The mounting electrode 22 is connected to an end portion of the signal line 16, with a metal joining material 23, an internal electrode 24, and an interlayer connection conductor 25 interposed therebetween. Openings 26 are provided at both ends in the longitudinal direction of the resin base material 15A so as to expose a portion of the ground conductor 17A and the mounting electrodes 22. The connector 21 is electrically connected to the ground conductor 17A and the mounting electrode 22 that are exposed through the opening 26.

In the first preferred embodiment, the structure 11A and the structure 11B are joined to each other by the metal joining material 13A with the joining electrode 12A interposed therebetween, thus forming the hollow portion 14A. Accordingly, it is easy to hold the hollow portion 14A in a process of joining the structure 11A and the structure 11B to each other. As a result, a distance between the ground conductor 17A and the signal line 16 is less likely to vary, and variations in transmission characteristics of the transmission line 10 are reduced.

FIGS. 4A to 4F are sectional views illustrating a method of manufacturing the transmission line 10.

Figure 4A:
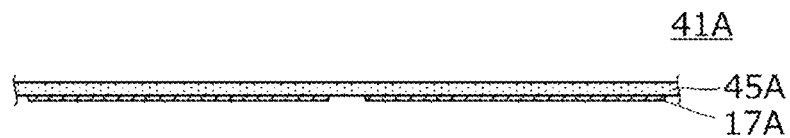
FIGS. 4A to 4F are sectional views illustrating a method of manufacturing the transmission line 10.

First, as illustrated in FIG. 4A, the ground conductor 17A and the mounting electrode 22 (see FIG. 2) are formed by patterning metal foil affixed to a resin base material 45A by photolithography or the like. Further, the opening 26 (see FIG. 2) is formed in the resin base material 45A by using a laser or the like. Thus, a structure 41A including a plurality of the structures 11A is formed.

Figure 4B:
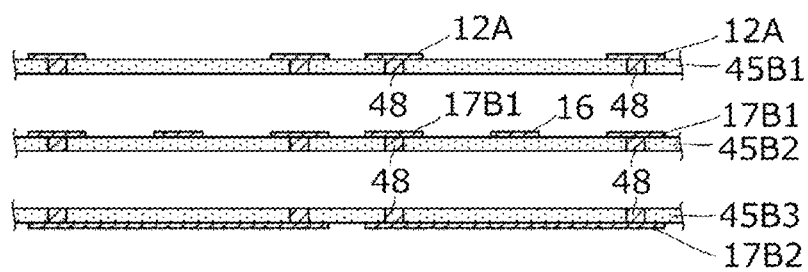

In addition, as illustrated in FIG. 4B, the joining electrode 12A, the signal line 16, the ground conductors 17B1 and 17B2, and the internal electrode 24 (see FIG. 2) are formed, by patterning metal foil affixed to the resin base materials 45B1, 45B2, and 45B3 by photolithography or the like. Further, a through-hole is formed in each of the resin base materials 45B1, 45B2, and 45B3 using a laser or the like, and the through-hole is filled with a conductive paste 48.

Figure 4C:
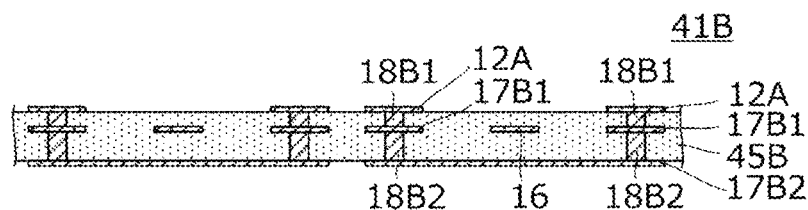

Next, as illustrated in FIG. 4C, the resin base materials 45B1, 45B2, and 45B3 are laminated and hot-pressed. Thus, the resin base materials 45B1, 45B2, and 45B3 are integrated to form the resin base material 45B, and the conductive paste 48 is solidified to form the interlayer connection conductors 18B1 and 18B2 and the interlayer connection conductor 25 (see FIG. 2). In this manner, a structure 41B including a plurality of the structures 11B is formed.

Figure 4D:
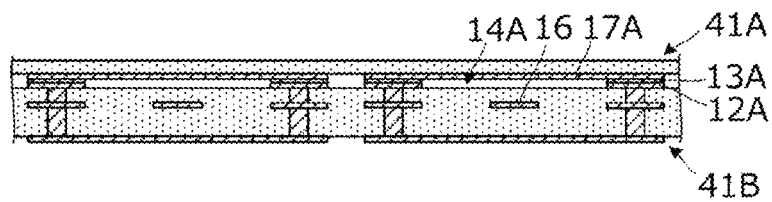

Next, as illustrated in FIG. 4D, for example, after a solder paste is applied to a surface of the joining electrode 12A, the structures 41A and 41B are laminated and heated, with the structures 41A and 41B affixed to each other. Accordingly, the structure 41A and the structure 41B are joined to each other by the metal joining material 13A with the joining electrode 12A interposed therebetween, such that the signal line 16 and the ground conductor 17A face each other with the hollow portion 14A interposed therebetween. The resin base material 45A and the resin base material 45B are not in contact with each other. A heating temperature during joining is higher than a melting point of a material forming the metal joining material 13A, and lower than a melting point of a material of the interlayer connection conductors 18B1 and 18B2.

As described above, by joining the structure 41A and the structure 41B with the structure 41A and the structure 41B affixed to each other, the hollow portion 14A can be secured between the signal line 16 and the ground conductor 17A, and a variation in height of the hollow portion 14A can be reduced.

Figure 4E:
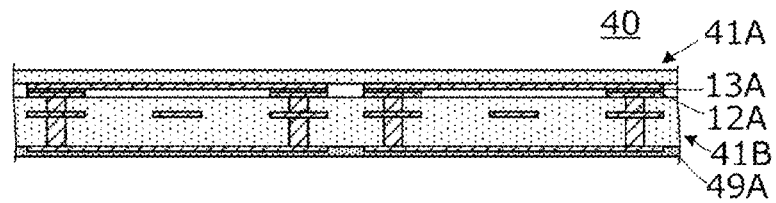

Next, as illustrated in FIG. 4E, a protection layer 49A is formed on a lower surface of the structure 41B by printing or the like, thus forming a collective board 40 including a plurality of the transmission lines 10.

Figure 4F:
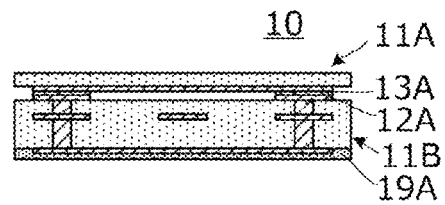

Finally, as illustrated in FIG. 4F, the collective board is separated into individual pieces to obtain individual transmission lines 10.

Figure 5:
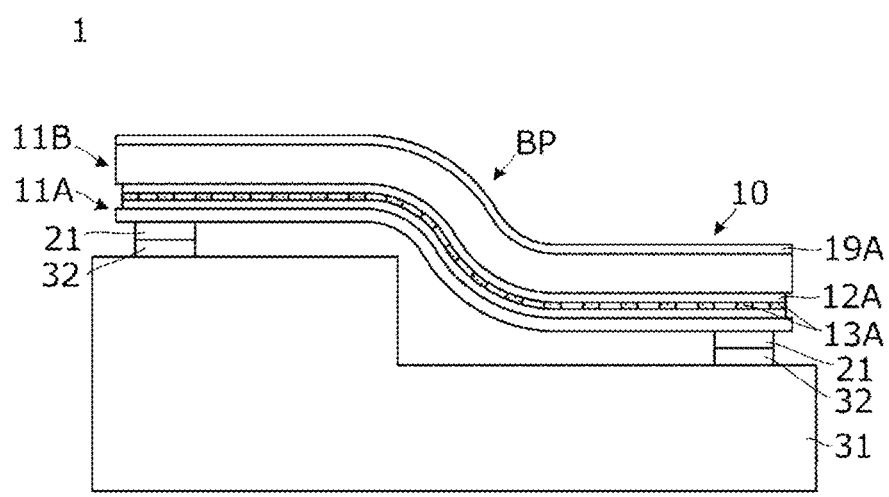
FIG. 5 is a conceptual side view of a mounting structure of the transmission line 10.

FIG. 5 is a side view of an electronic apparatus 1 including the transmission line 10. The electronic apparatus 1 includes the transmission line 10, a circuit board 31, and a connector 32. As illustrated in FIG. 5, the transmission line 10 can also be mounted on the circuit board 31 including a step. The connectors 21 of the transmission line 10 are connected to the respective connectors 32 of the circuit board 31. The transmission line 10 is bent along the step of the circuit board 31. The metal joining material 13A disposed on a bent portion BP of the transmission line 10 is bent by plastic deformation. In a process of bending the transmission line 10, the metal joining material 13A is plastically deformed by heating. To be specific, after the metal joining material 13A is melted or softened and deformed by heating, the deformed metal joining material 13A is solidified by cooling. Accordingly, it is possible to obtain the transmission line 10 in which a bent shape is maintained.

Note that, by using a thermoplastic resin as the material of the resin base materials 15A and 15B of the transmission line 10, the bent shape of the transmission line 10 can also be maintained when the resin base materials 15A and 15B are plastically deformed.

Note that, the hollow portion 14A need not be provided in the bent portion BP. In this case, the hollow portion 14A is not deformed at the bent portion BP, and the transmission characteristics of the transmission line 10 are less likely to change.

Second Preferred Embodiment

In a second preferred embodiment, a hollow portion is located on each of an upper side and a lower side of a signal line.

Figure 6:
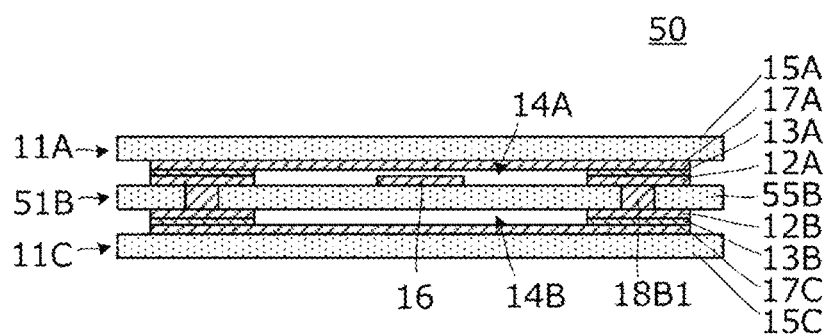
FIG. 6 is a sectional view of a transmission line 50 according to a second preferred embodiment of the present invention.

FIG. 6 is a sectional view of a transmission line 50 according to the second preferred embodiment of the present invention.

The transmission line 50 includes the structures 11A, 51B, and 11C. The structure 11C is an example of a "third structure". The structures 11A, 51B, and 11C are disposed in this order from an upper side to a lower side. The structure 11A and the structure 51B are joined to each other by the metal joining material 13A with the joining electrode 12A defining a spacer interposed therebetween. The structure 51B and the structure 11C are joined to each other by a metal joining material 13B with a joining electrode 12B forming a spacer interposed therebetween. The joining electrode 12B is an example of a "second spacer". The metal joining material 13B is an example of a "second metal joining material".

The structure 51B includes a resin base material 55B, the signal line 16, and the interlayer connection conductor 18B1. The resin base material 55B has flexibility. The signal line 16 is disposed on an upper surface of the resin base material 55B. The signal line 16 and the ground conductor 17A face each other with the hollow portion 14A interposed therebetween in a joining direction.

The joining electrode 12A is provided on the upper surface of the resin base material 55B. The joining electrode 12A is disposed between the structure 11A and the structure 51B. The joining electrode 12B is provided on a lower surface of the resin base material 55B. The joining electrode 12B is disposed between the structure 55B and the structure 11C. The joining electrodes 12A and 12B extend in a longitudinal direction of the structure 51B at both ends in a width direction of the structure 51B. The joining electrode 12A is joined and electrically connected to the joining electrode 12B with the interlayer connection conductor 18B1 interposed therebetween.

The structure 11C includes a resin base material 15C and a ground conductor 17C. The resin base material 15C is an example of a "third resin base material". The ground conductor 17C is an example of a "third ground conductor". The resin base material 15C has flexibility. The resin base material 55B and the resin base material 15C may be formed of materials of the same kind, or may be formed of materials having characteristics different from each other. The ground conductor 17C is disposed on substantially an entire upper surface of the resin base material 15C. In other words, the structure 11C is similar to the structure 11A. The structure 11C is disposed on a lower side of the structure 51B with a surface on which the ground conductor 17C is disposed facing upward.

The ground conductor 17A is disposed inside the resin base material 15A, and the ground conductor 17C is disposed inside the resin base material 15C. This makes protection layers to protect the ground conductors 17A and 17C unnecessary.

The structure 51B and the structure 11C are joined to each other with the joining electrode 12B interposed therebetween to define a hollow portion 14B. The hollow portion 14B is an example of a "second hollow portion". The signal line 16 and the ground conductor 17C face each other with the hollow portion 14B and the resin base material 55B interposed therebetween in the joining direction. The resin base material 55B and the resin base material 15C are not in contact with each other.

The metal joining material 13B joins and electrically connects the joining electrode 12B and the ground conductor 17C to each other. The metal joining material 13B is made of, for example, solder, and has a melting point lower than that of the interlayer connection conductor 18B1.

In the second preferred embodiment, the hollow portion 14B is also located between the signal line 16 and the ground conductor 17C. Thus, a transmission loss of the transmission line 10 is further reduced.

Third Preferred Embodiment

In a third preferred embodiment, a hollow portion is located on each of an upper side and a lower side of a signal line, and the signal line faces a ground conductor with a resin base material and the hollow portion interposed therebetween.

Figure 7:
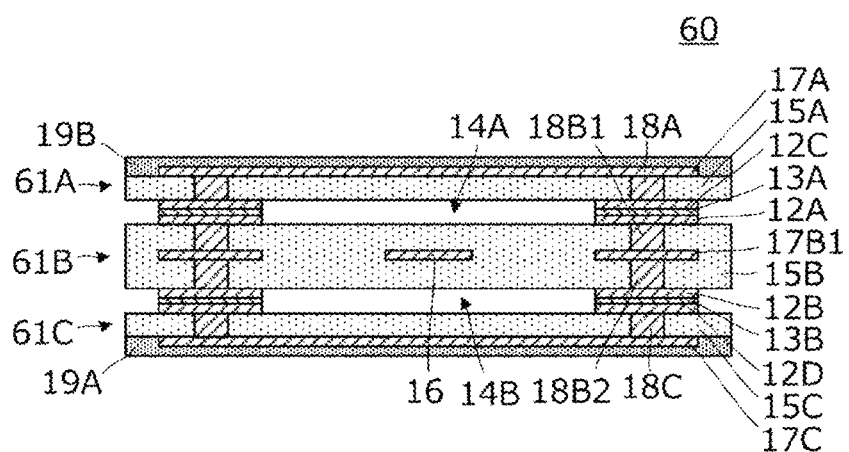
FIG. 7 is a sectional view of a transmission line 60 according to a third preferred embodiment of the present invention.

FIG. 7 is a sectional view of a transmission line 60 according to the third preferred embodiment of the present invention.

The transmission line 60 includes structures 61A, 61B, and 61C. The structures 61A, 61B, and 61C are disposed in this order from an upper side to a lower side. The structure 61A and the structure 61B are joined to each other by the metal joining material 13A with the joining electrode 12A and a joining electrode 12C that define a spacer interposed therebetween. The structure 61B and the structure 61C are joined to each other by the metal joining material 13B with the joining electrode 12B and a joining electrode 12D that define a spacer interposed therebetween.

The structure 61A includes the resin base material 15A, the ground conductor 17A, and an interlayer connection conductor 18A. The ground conductor 17A is disposed on substantially an entire upper surface of the resin base material 15A. The structure 61B includes the resin base material 15B, the signal line 16, the ground conductor 17B1, and interlayer connection conductors 18B1 and 18B2. The signal line 16 and the ground conductor 17B1 are provided in an inner layer of the resin base material 15B as in the first preferred embodiment. The structure 61C includes the resin base material 15C, the ground conductor 17C, and an interlayer connection conductor 18C. The ground conductor 17C is disposed on substantially an entire lower surface of the resin base material 15C. The structure 61C is similar to the structure 61A. The structure 61C is disposed on a lower side of the structure 61B with a surface on which the ground conductor 17C is disposed facing downward.

The joining electrodes 12A and 12B are provided on an upper surface and a lower surface of the resin base material 15B, respectively. The joining electrode 12C is provided on a lower surface of the resin base material 15A. The joining electrode 12D is provided on an upper surface of the resin base material 15C.

The joining electrodes 12A and 12B are joined to and electrically connected to the ground conductor 17B1 with the interlayer connection conductors 18B1 and 18B2 interposed therebetween, respectively. The joining electrode 12C is joined to and electrically connected to the ground conductor 17A with the interlayer connection conductor 18A interposed therebetween. The joining electrode 12D is joined to and electrically connected to the ground conductor 17C with the interlayer connection conductor 18C interposed therebetween. The joining electrode 12A and the joining electrode 12C are joined and electrically connected to each other with the metal joining material 13A interposed therebetween. The joining electrode 12B and the joining electrode 12D are joined and electrically connected to each other with the metal joining material 13B interposed therebetween.

The structure 61A and the structure 61B are joined to each other with the joining electrodes 12A and 12C interposed therebetween, to form the hollow portion 14A. The structure 61B and the structure 61C are joined to each other with the joining electrodes 12B and 12D interposed therebetween to form the hollow portion 14B. The signal line 16 and the ground conductor 17A face each other with the hollow portion 14A and the resin base materials 15A and 15B interposed therebetween in a joining direction. The signal line 16 and the ground conductor 17C face each other with the hollow portion 14B and the resin base materials 15B and 15C interposed therebetween in the joining direction.

The protection layer 19A and a protection layer 19B are provided on the upper surface of the resin base material 15A and the lower surface of the resin base material 15C, respectively.

Figure 8:
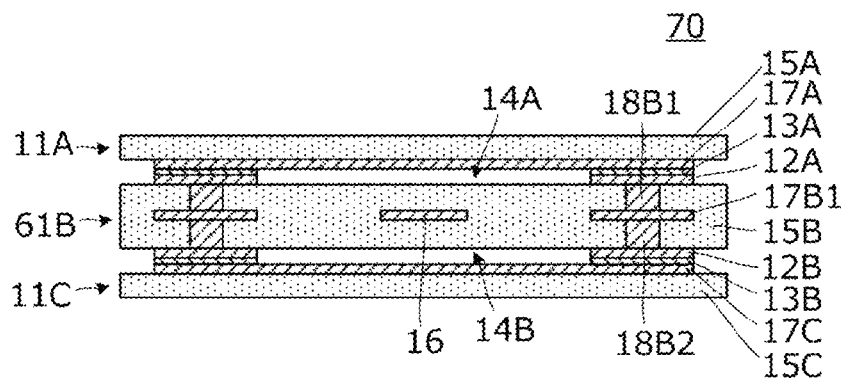
FIG. 8 is a sectional view of a transmission line 70 according to a modification of the third preferred embodiment of the present invention.

FIG. 8 is a sectional view of a transmission line 70 according to a modification of the third preferred embodiment of the present invention. The transmission line 70 is different from the transmission line 60 (see FIG. 7) in the following points. The transmission line 70 includes the structures 11A and 11C instead of the structures 61A and 61C, the joining electrodes 12C and 12D, and the protection layers 19A and 19B. The structures 11A, 61B, and 11C are disposed in this order from an upper side to a lower side. The structure 11A and the structure 61B are joined to each other by the metal joining material 13A with the joining electrode 12A defining a spacer interposed therebetween. The structure 61B and the structure 11C are joined to each other by the metal joining material 13B with the joining electrode 12B defining a spacer interposed therebetween.

In the third preferred embodiment, the signal line 16 faces the ground conductor 17A with the hollow portion 14A and the resin base material interposed therebetween. Accordingly, even when the hollow portion 14A is deformed, a short circuit between the signal line 16 and the ground conductor 17A is prevented by the resin base material disposed between the signal line 16 and the ground conductor 17A. Similarly, the signal line 16 faces the ground conductor 17C with the hollow portion 14B and the resin base material interposed therebetween. Accordingly, even when the hollow portion 14B is deformed, a short circuit between the signal line 16 and the ground conductor 17C is prevented by the resin base material disposed between the signal line 16 and the ground conductor 17C.

Note that, in the third preferred embodiment, it is preferable that the structure 11A and the structure 11C be harder than the structure 61B. For example, it is preferable that Young's modulus of each of the resin base material 15A of the structure 11A and the resin base material 15C of the structure 11C be higher than Young's modulus of the resin base material 15B of the structure 61B. In addition, it is preferable that a coefficient of linear expansion CTE of each of the resin base material 15A of the structure 11A and the resin base material 15C of the structure 11C be larger than a CTE of the resin base material 15B of the structure 61B. Thus, unnecessary deformation of the hollow portion 14A and the hollow portion 14B is reduced or prevented.

Furthermore, it is preferable that the resin base material 15A of the structure 11A and the resin base material 15C of the structure 11C be made of the same material, and this makes it possible to reduce or prevent warpage of the transmission line 70.

Fourth Preferred Embodiment

In a fourth preferred embodiment, at a position where a signal line faces a ground conductor, a thickness of a resin base material in which the signal line is located is reduced such that a ratio of a resin portion positioned between the signal line and the ground conductor decreases in a joining direction.

Figure 9:
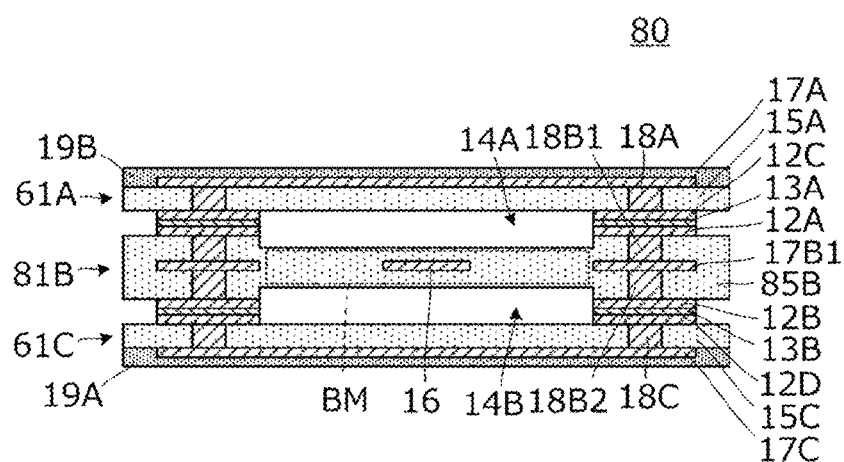
FIG. 9 is a sectional view of a transmission line 80 according to a fourth preferred embodiment of the present invention.

FIG. 9 is a sectional view of a transmission line 80 according to the fourth preferred embodiment of the present invention. The transmission line 80 is different from the transmission line 60 (see FIG. 7) according to the third preferred embodiment in the following points. The transmission line 80 includes a structure 81B including a resin base material 85B instead of the structure 61B including the resin base material 15B.

The resin base material 85B includes a portion BM at a position where the signal line 16 faces the ground conductors 17A and 17C. The portion BM of the resin base material 85B is thinner than a portion of the resin base material 85B that does not face the hollow portions 14A and 14B, in other words, thinner than an end portion of the resin base material 85B in a short direction. The portion BM of the resin base material 85B is thinned by forming a recess on each of an upper surface and a lower surface of the resin base material 85B. That is, the transmission line 80 includes a portion in which a thickness of the resin base material 85B is reduced, at a position where the signal line 16 faces the ground conductors 17A and 17C such that a ratio of a resin portion positioned between the signal line 16 and each of the ground conductors 17A and 17C decreases in a joining direction.

The portion BM of the resin base material 85B extends along the signal line 16. A width of the portion BM of the resin base material 85B may be slightly larger than a width of the signal line 16, the same as the width of the signal line 16, or slightly smaller than the width of the signal line 16.

The portion BM of the resin base material 85B may be formed by digging (countersinking) the resin base material by plasma processing or the like. Alternatively, the portion BM of the resin base material 85B may be formed by laminating resin base materials each having an opening formed in a portion thereof.

In the fourth preferred embodiment, a thickness of the resin base material 85B is reduced, at a position where the signal line 16 faces the ground conductors 17A and 17C such that the ratio of the resin portion positioned between the signal line 16 and each of the ground conductors 17A and 17C decreases in the joining direction. As a result, a relative dielectric constant decreases between a layer in which the signal line 16 is disposed and layers in which the ground conductors 17A and 17C are disposed. Accordingly, when characteristic impedance of the transmission line 60 is set to a desired value, a line width of the signal line 16 can be increased, thus reducing a conductor loss caused in the signal line 16.

Fifth Preferred Embodiment

In a fifth preferred embodiment, a joining electrode and a metal block define a spacer.

Figure 10:
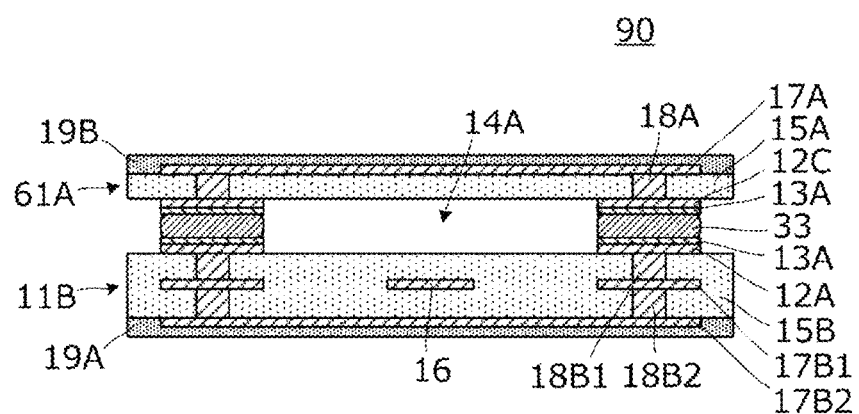
FIG. 10 is a sectional view of a transmission line 90 according to a fifth preferred embodiment of the present invention.

FIG. 10 is a sectional view of a transmission line 90 according to the fifth preferred embodiment of the present invention.

The transmission line 90 includes the structure 61A and the structure 11B. The structure 61A and the structure 11B are joined to each other by the metal joining material 13A with the joining electrodes 12A and 12C and a metal block 33 interposed therebetween. The protection layers 19A and 19B are provided on an upper surface of the structure 61A and a lower surface of the structure 11B, respectively.

The joining electrodes 12A and 12C and the metal block 33 define a spacer. The metal block 33 is thicker than each of the signal line 16, the ground conductors 17A, 17B1, and 17B2, and the joining electrodes 12A and 12C. That is, the spacer includes a conductor thicker than the conductor defining the signal line 16.

The metal block 33 is disposed between the joining electrode 12A and the joining electrode 12C. The metal blocks 33 are disposed at intervals along a longitudinal direction of the transmission line 90, at both ends in a width direction of the transmission line 10. The metal block 33 is joined and electrically connected to each of the joining electrodes 12A and 12C by the metal joining material 13A.

In the fifth preferred embodiment, the joining electrodes 12A and 12C and the metal block 33 define the spacer. Accordingly, the hollow portion 14A between the structure 61A and the structure 11B can be appropriately increased.

Sixth Preferred Embodiment

In a sixth preferred embodiment, a joining electrode and a resin base material define a spacer.

Figure 11:
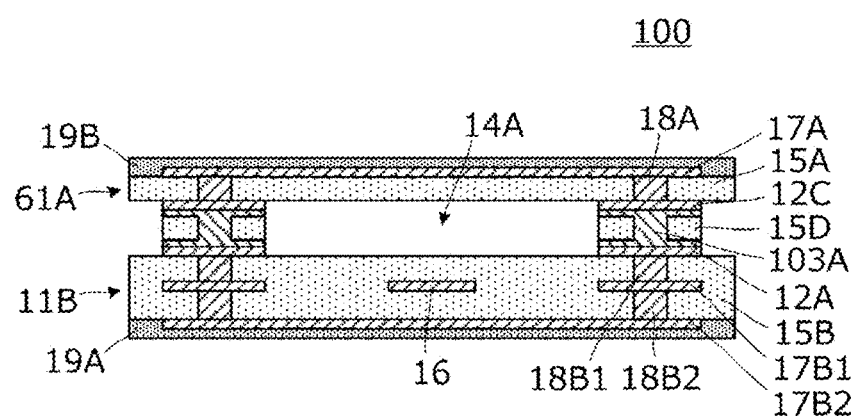
FIG. 11 is a sectional view of a transmission line 100 according to a sixth preferred embodiment of the present invention.

FIG. 11 is a sectional view of a transmission line 100 according to the sixth preferred embodiment of the present invention. The transmission line 100 is different from the transmission line 90 (see FIG. 10) according to the fifth preferred embodiment in the following points. The transmission line 100 includes a resin base material 15D having flexibility and a metal joining material 103A, instead of the metal block 33 and the metal joining material 13A.

The joining electrodes 12A and 12C and the resin base material 15D define a spacer. The resin base material 15D is disposed between the joining electrode 12A and the joining electrode 12C. The resin base material 15D extends in a longitudinal direction of the transmission line 100 at both ends in a width direction of the transmission line 100. The resin base material 15D includes through-holes at intervals along a longitudinal direction of the resin base material 15D. The through-holes in the resin base material 15D are filled with the metal joining material 103A which is made of, for example, solder. The metal joining material 103A joins and electrically connects the joining electrode 12A and the joining electrode 12C to each other. Accordingly, the metal joining material 103A joins the structure 61A and the structure 11B to each other with the joining electrodes 12A and 12C and the resin base material 15D interposed therebetween.

In the sixth preferred embodiment, a position of the metal joining material 103A is fixed by filling the through-hole of the resin base material 15D with the metal joining material 103A.

Note that, unlike the sixth preferred embodiment, after an interlayer connection conductor is formed in the resin base material 15D with a conductive material having a relatively high melting point such as a Cu—Sn alloy, the interlayer connection conductor may be joined to each of the joining electrodes 12A and 12C using a metal joining material having a relatively low melting point such as solder. Note that, in the transmission line 100, the joining electrodes 12A and 12C are not necessarily provided. In this case, the metal joining material 103A is joined to the interlayer connection conductors 18A and 18B1. In addition, in the transmission line 100, a joining electrode may further be provided on the resin base material 15D. In this case, the joining electrode on the resin base material 15D is joined to the joining electrode 12C with a metal joining material interposed therebetween. Similarly, in the transmission line 100, a joining electrode may further be provided under the resin base material 15D. In this case, the joining electrode under the resin base material 15D is joined to the joining electrode 12A with a metal joining material interposed therebetween.

Seventh Preferred Embodiment

In a seventh preferred embodiment, in the transmission line 10, the ground conductor 17A is provided with slits SL and the joining electrode 12A is divided into multiple pieces.

Figure 12:
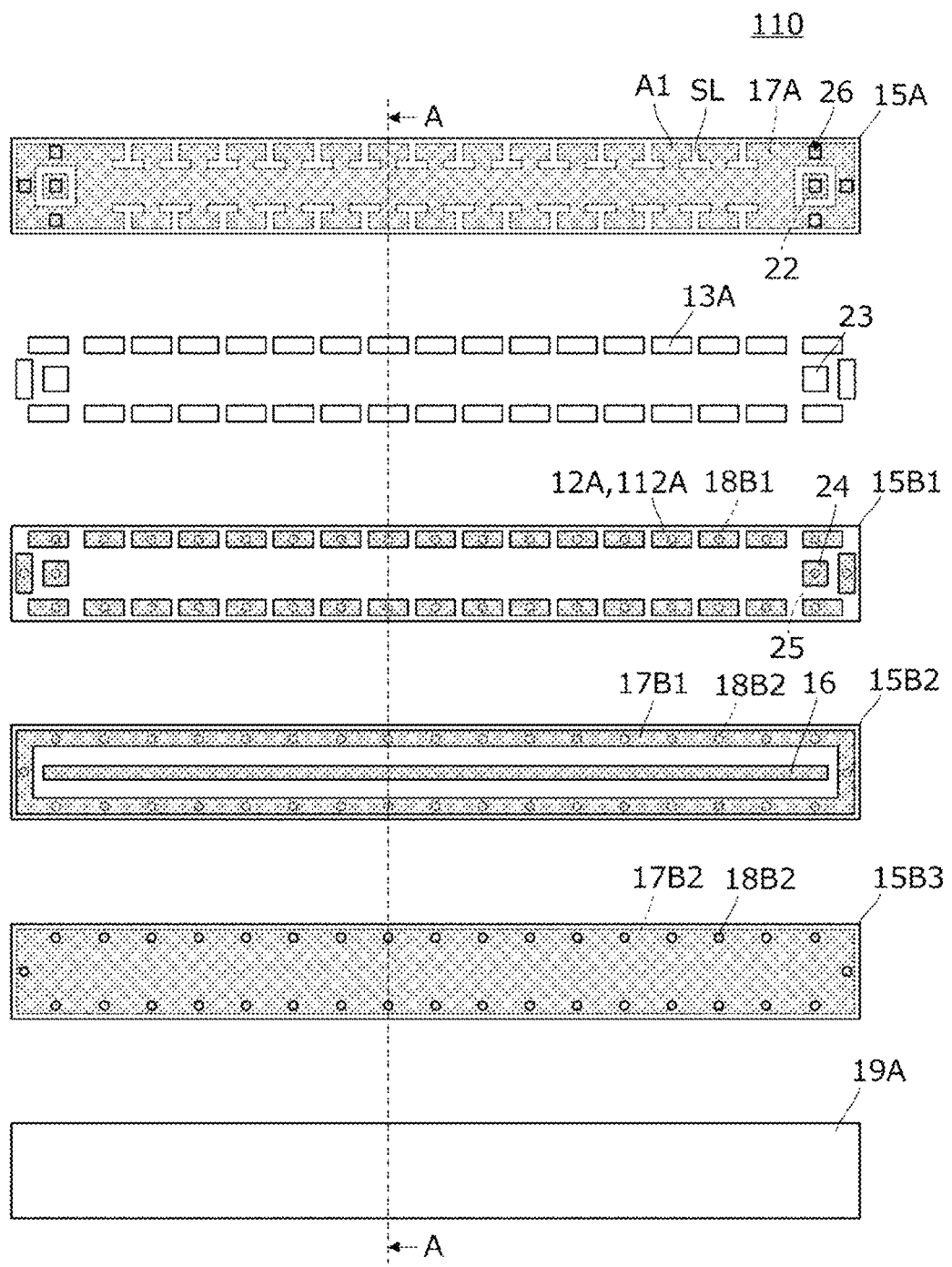
FIG. 12 is a plan view of each layer of a transmission line 110 according to a seventh preferred embodiment of the present invention.

FIG. 12 is a plan view of each layer of a transmission line 110 according to the seventh preferred embodiment of the present invention. As illustrated in FIG. 12, the joining electrode 12A is divided into rectangular-shaped small joining electrodes 112A (small spacers). The ground conductor 17A is provided with a plurality of slits SLs. By providing the plurality of slits SLs, a plurality of rectangular-shaped connection regions A1 is provided. Each of the connection regions A1 overlaps with a corresponding one of the small joining electrodes 112A when viewed in a top-bottom direction. Thus, the metal joining material 13A is prevented from spreading out on the joining electrode 12A and the ground conductor 17A. This makes it easy to keep the metal joining material 13A uniform in thickness, and a variation in thickness of the hollow portion 14A is reduced or prevented.

Eighth Preferred Embodiment

In an eighth preferred embodiment, in the transmission line 10, a metal ball 113A is present in the metal joining material 13A.

Figure 13:
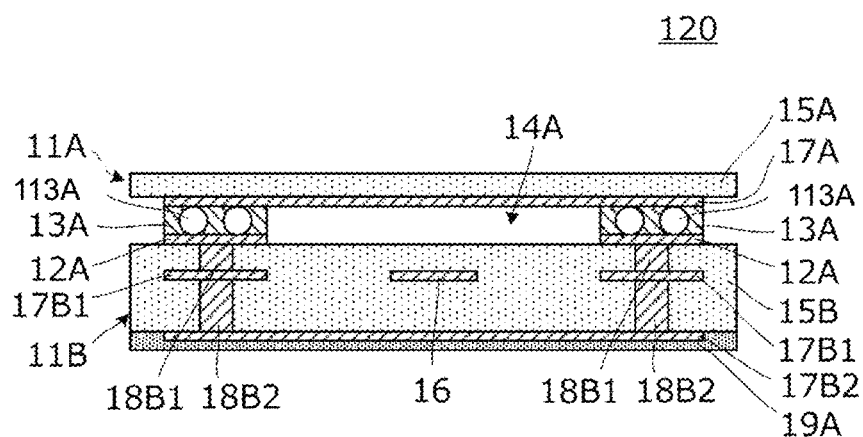
FIG. 13 is a sectional view of a transmission line 120 according to an eighth preferred embodiment of the present invention.

FIG. 13 is a sectional view of a transmission line 120 according to the eighth preferred embodiment of the present invention. The transmission line 120 is provided with a plurality of the metal balls 113A. The metal balls 113A are spheres. Further, the metal balls 113A are uniform in size. The plurality of metal balls 113A is provided in the metal joining material 13A. The metal balls 113A are manufactured using Ni, which has a melting point higher than that of the metal joining material 13A (that is, solder). Thus, a thickness of the metal joining material 13A can be made larger than a thickness of the joining electrode 12A. As a result, the hollow portion 14A can be increased.

Ninth Preferred Embodiment

In a ninth preferred embodiment, a protection film 300 is provided in the transmission line 50.

Figure 14:
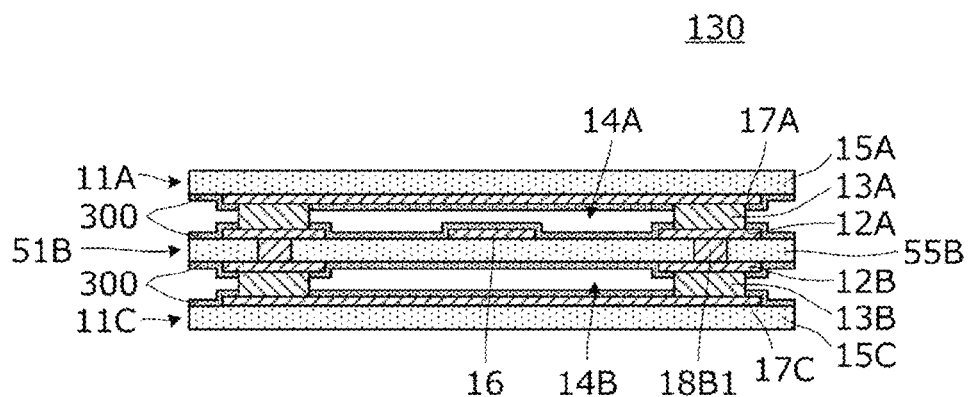
FIG. 14 is a sectional view of a transmission line 130 according to a ninth preferred embodiment of the present invention.

FIG. 14 is a sectional view of a transmission line 130 according to the ninth preferred embodiment of the present invention. The transmission line 130 further includes the protection film 300. The protection films 300 cover respective surfaces of the resin base material 15A and the resin base material 55B, the surfaces facing each other. To be specific, the protection film 300 is provided on each of a lower surface of the resin base material 15A, an upper surface of the resin base material 55B, a lower surface of the resin base material 55B, and an upper surface of the resin base material 15C. However, when a dielectric constant of the protection film 300 is higher than a dielectric constant of each of the resin base materials 15A, 55B, and 15C, characteristics of high-frequency characteristics of the transmission line 80 are affected. Thus, a thickness of the protection film 300 is reduced. The thickness of the protection film 300 is smaller than, for example, a thickness of the resin base material 55B. Since the protection film 300 covers each of the joining electrodes 12A and 12B, the metal joining materials 13A and 13B are prevented from spreading out.

Tenth Preferred Embodiment

In a tenth preferred embodiment, the transmission line 10 includes a multi-core structure.

Figure 15:
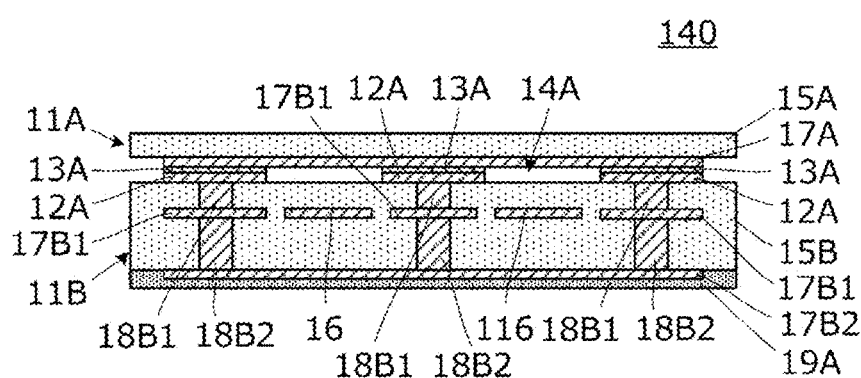
FIG. 15 is a sectional view of a transmission line 140 according to a tenth preferred embodiment of the present invention.

FIG. 15 is a sectional view of a transmission line 140 according to the tenth preferred embodiment of the present invention. The transmission line 140 further includes a signal line 116. The signal line 116 is provided in the resin base material 15B so as to extend parallel to the signal line 16. Additionally, the joining electrode 12A, the ground conductor 17B1, and an interlayer connection conductor 18B1, 18B2 are provided between the signal line 16 and the signal line 116. This ensures isolation between the signal line 16 and the signal line 116.

Eleventh Preferred Embodiment

In an eleventh preferred embodiment, the transmission line 10 includes a multi-core structure.

Figure 16:
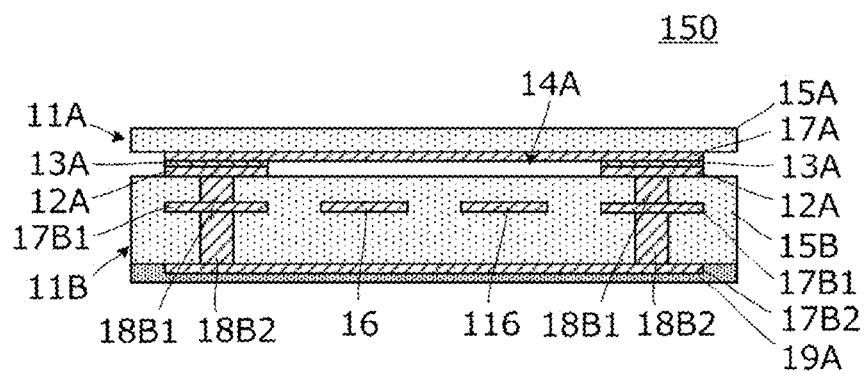
FIG. 16 is a sectional view of a transmission line 150 according to an eleventh preferred embodiment of the present invention.

FIG. 16 is a sectional view of a transmission line 150 according to the eleventh preferred embodiment of the present invention. The transmission line 150 further includes the signal line 116. The signal line 116 is provided in the resin base material 15B so as to extend parallel to the signal line 16. However, the joining electrode 12A, the ground conductor 17B1, and the interlayer connection conductor 18B1 and 18B2 are not provided between the signal line 16 and the signal line 116. In such a transmission line 140, the signal line 16 and the signal line 116 form a differential transmission line.

Twelfth Preferred Embodiment

In a twelfth preferred embodiment, the connector 21 is mounted on one of two surfaces of a transmission line 160, the one surface being spaced away from the hollow portion 14A.

Figure 17:
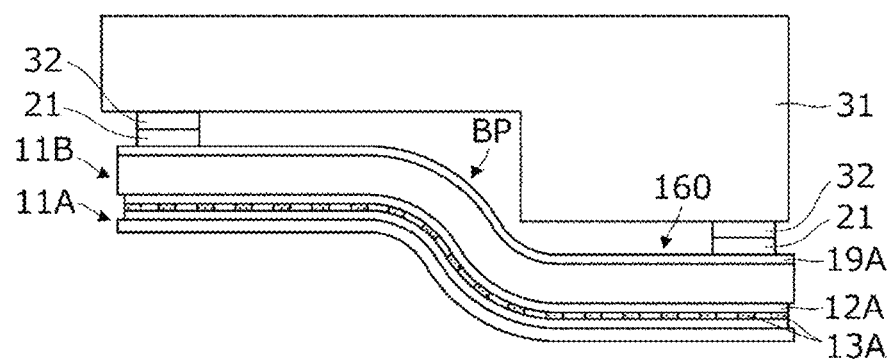
FIG. 17 is a side view of a transmission line 160 according to a twelfth preferred embodiment of the present invention.

FIG. 17 is a side view of the transmission line 160 according to the twelfth preferred embodiment of the present invention. In the transmission line 160, the connector 21 is mounted on one of the two surfaces of the transmission line 160, the one surface being away from the hollow portion 14A. The surface of the transmission line 160 away from the hollow portion 14A is less likely to be deformed, compared to a surface of the transmission line 160 close to the hollow portion 14A. Thus, the connector 21 is stably mounted on the transmission line 160.

Thirteenth Preferred Embodiment

In a thirteenth preferred embodiment, the metal joining material 13A has a rectangular shape in the transmission line 10.

Figure 18:
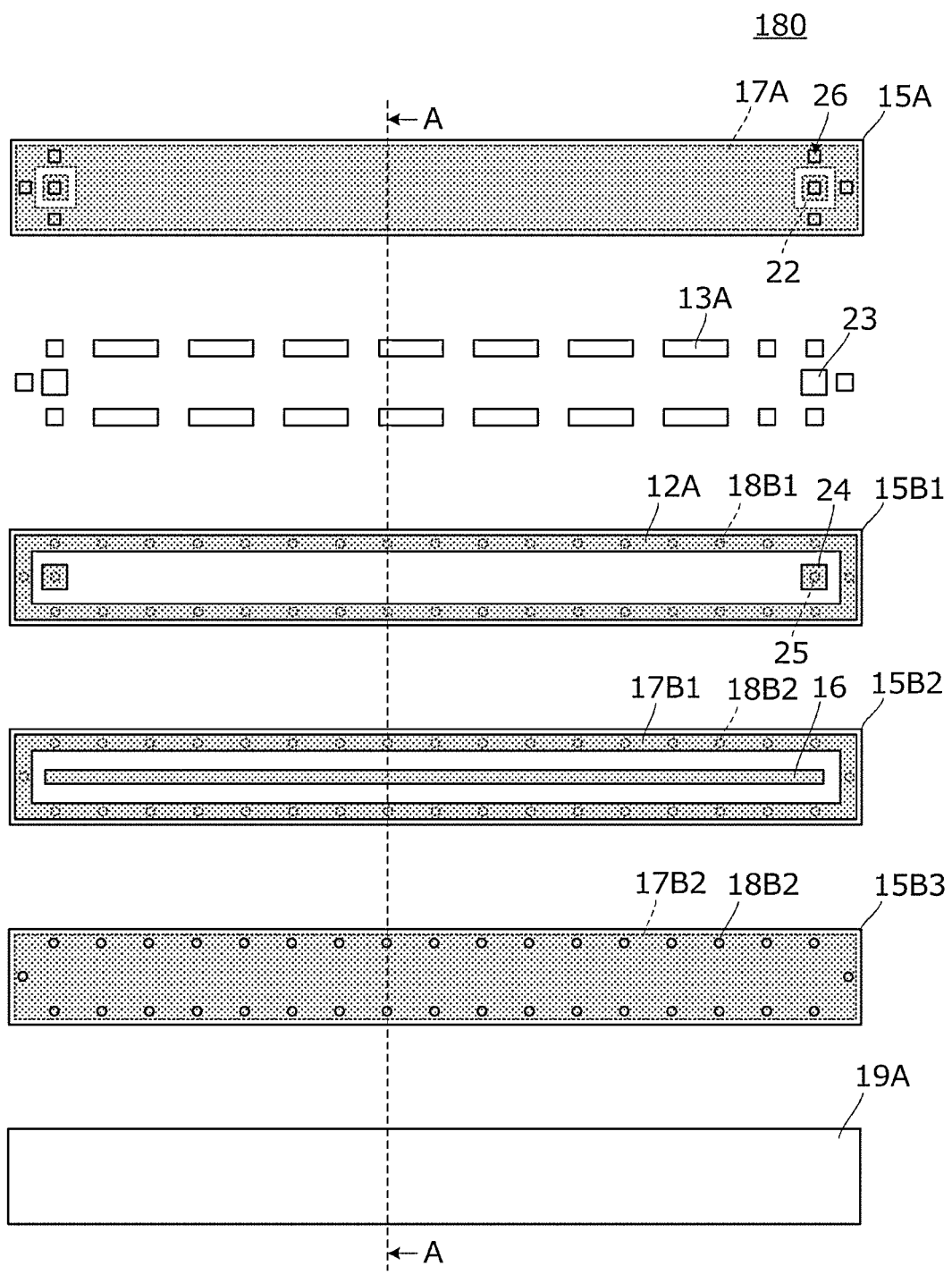
FIG. 18 is a plan view of each layer of a transmission line 180 according to a thirteenth preferred embodiment of the present invention.

FIG. 18 is a plan view of each layer of a transmission line 180 according to the thirteenth preferred embodiment of the present invention. The metal joining material 13A has a rectangular shape having a long side extending in an extending direction of the signal line 16. Thus, the metal joining material 13A effectively defines and functions as a shield. Furthermore, deformation of the transmission line 180 can be reduced or prevented more effectively.

Specific Example of Terminal Portion

Figure 19A:
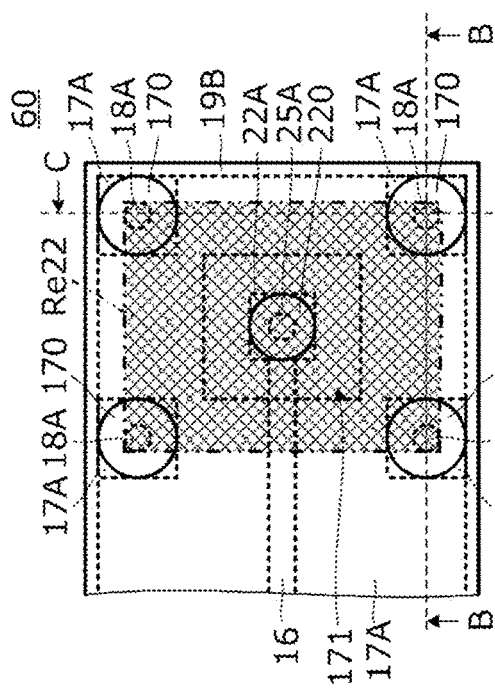
FIG. 19A is a partial plan view of a transmission line 60 according to a preferred embodiment of the present invention.
Figure 19B:
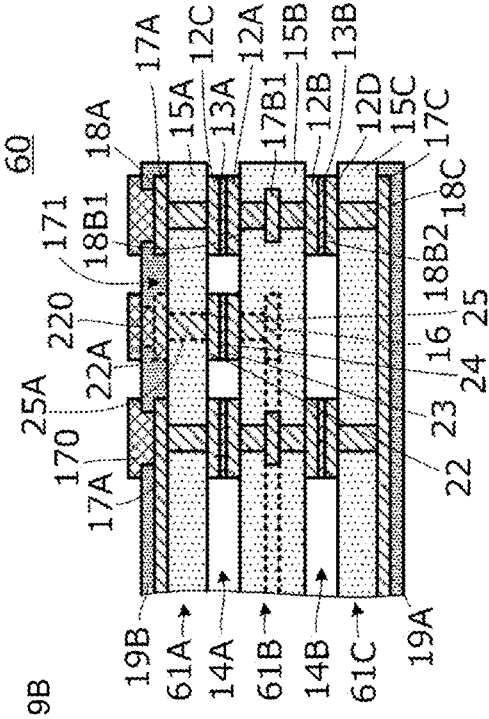
FIGS. 19B and 19C are sectional views of the transmission line 60.
Figure 19C:
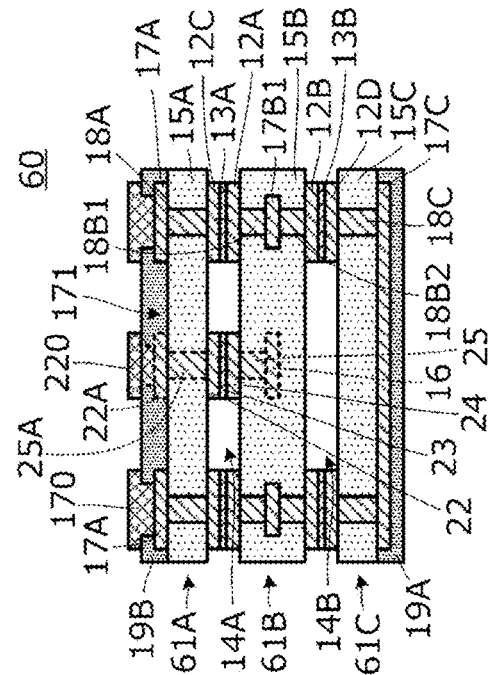

FIG. 19A is a partial plan view of a transmission line 60 according to a preferred embodiment of the present invention, and FIGS. 19B and 19C are sectional views of the transmission line 60. FIG. 19B is a sectional view taken along line B-B in FIGS. 19B and 19C is a sectional view taken along line C-C in FIG. 19A.

As illustrated in FIGS. 19A to 19C, a terminal portion of the transmission line 60 includes four sets of the joining electrode 12A, the joining electrode 12B, the joining electrode 12C, the joining electrode 12D, the metal joining material 13A, the metal joining material 13B, the ground conductor 17B1, the interlayer connection conductor 18A, the interlayer connection conductor 18B1, the interlayer connection conductor 18B2, and the interlayer connection conductor 18C.

In each set, in a thickness direction of the transmission line 60, from the ground conductor 17A toward the ground conductor 17C, the interlayer connection conductor 18A, the joining electrode 12C, the metal joining material 13A, the joining electrode 12A, the interlayer connection conductor 18B1, the ground conductor 17B1, the interlayer connection conductor 18B2, the joining electrode 12B, the metal joining material 13B, the joining electrode 12D, and the interlayer connection conductor 18C are arranged in this order, and overlap with each other in plan view. That is, a columnar body having a predetermined strength is defined by these components.

In other words, in the terminal portion of the transmission line 60, a positional relationship among the structure 61A, the structure 61B, and the structure 61C is maintained by these four columnar bodies. To be more specific, in the terminal portion of the transmission line 60, a structure including the hollow portion 14A between the structure 61A and the structure 61B and including the hollow portion 14B between the structure 61B and the structure 61C is maintained by these four columnar bodies. These four columnar bodies are disposed so as to define a rectangular shape in a region Re22 in plan view.

The mounting electrode 22, a mounting auxiliary electrode 22A, and the interlayer connection conductor 25A are provided in or on the resin base material 15A. Additionally, an opening 171 is provided in the ground conductor 17A on the resin base material 15A.

The opening 171 is a region where no conductor is located in the ground conductor 17A on an upper surface of the resin base material 15A. The opening 171 is disposed in the region Re22 described above.

The mounting auxiliary electrode 22A is disposed on an upper surface side of the resin base material 15A, and is disposed in the opening 171. Thus, the mounting auxiliary electrode 22A is disposed in the region Re22. Further, the mounting auxiliary electrode 22A is disposed at a position overlapping with the mounting electrode 22 in plan view. The mounting auxiliary electrode 22A is connected to the mounting electrode 22 with the interlayer connection conductor 25A interposed therebetween. The mounting electrode 22 is connected to the internal electrode 24 with the metal joining material 23 interposed therebetween, and the internal electrode 24 is connected to the signal line 16 with the interlayer connection conductor 25 interposed therebetween.

In this configuration, in plan view, a portion connected to the signal line 16 from the mounting auxiliary electrode 22A is surrounded by the four columnar bodies.

In such a configuration, when the connector 21 is mounted on the transmission line 60, a solder bump 170 is formed by providing an opening in each of a portion of the mounting auxiliary electrode 22A in the protection layer 19B and a portion of the ground conductor 17A. Positions where the respective solder bumps 170 are provided on the ground conductor 17A are positions overlapping with the four columnar bodies. By using the solder bumps 170, the mounting auxiliary electrode 22A and four portions of the ground conductor 17A are joined to terminals of the connector 21.

In this case, by using the above-described structure of the terminal portion, the following effects can be achieved.

Figure 20A:
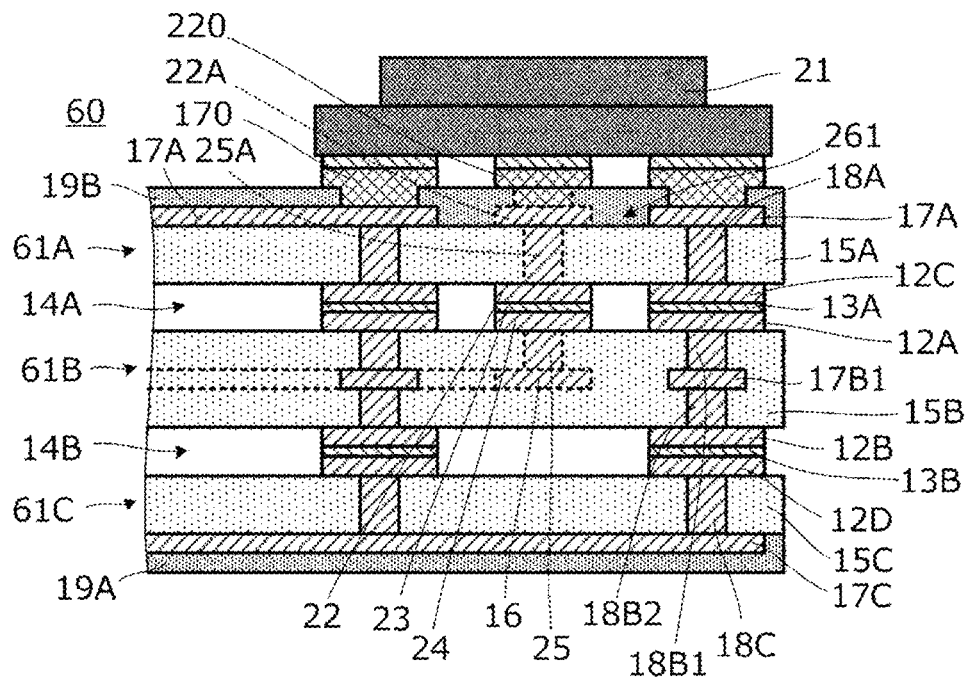
FIG. 20A is a sectional view illustrating a state in which a connector 21 is mounted on the transmission line 60 having a configuration of the present invention.
Figure 20B:
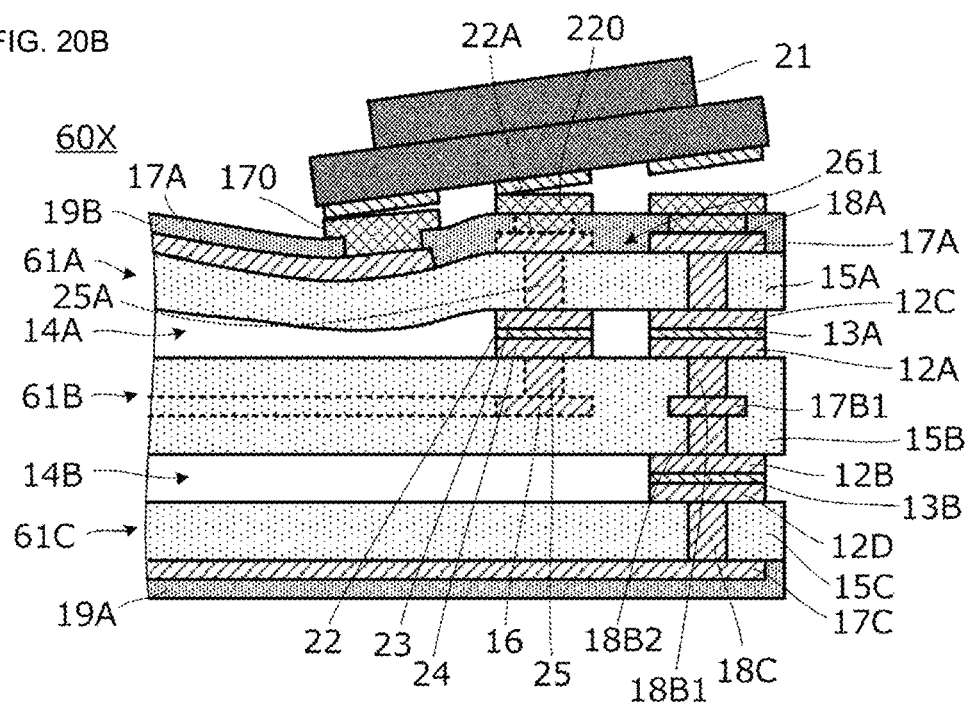
FIG. 20B is a sectional view illustrating a state in which the connector 21 is mounted on a transmission line 60X of a comparative example.

FIG. 20A is a sectional view illustrating a state in which the connector 21 is mounted on the transmission line 60 having the configuration according to the present preferred embodiment. FIG. 20B is a sectional view illustrating a state in which the connector 21 is mounted on a transmission line 60X of a comparative example. The transmission line 60X of the comparative example is not provided with the above-described columnar body that connects the ground conductor 17A and the ground conductor 17C, on a side closer to a center of the transmission line 60X than the mounting electrode 22 in a longitudinal direction.

As illustrated in FIG. 20A, in the transmission line 60, the connector 21 is mounted on a portion supported by four columnar bodies. Accordingly, in a case of mounting the connector 21, even when the connector 21 is mounted on the transmission line 60 while a predetermined pressure is applied, the connector 21 is supported by the four columnar bodies. Thus, even when the transmission line 60 includes the hollow portion 14A, deformation of the transmission line 60, more specifically, deformation in which the structure 61A is recessed (see FIG. 20B) can be suppressed.

On the other hand, as illustrated in FIG. 20B, in the transmission line 60X of the comparative example, the connector 21 pushes the structure 61A at a connecting portion with the ground conductor 17A on a side closer to a center than the mounting auxiliary electrode 22A, and there is a high possibility that the structure 61A is recessed and deformed. When the structure 61A is recessed, the connector 21 is inclined, and there is a high possibility that a joining failure occurs.

In this manner, by using the structure of the terminal portion described above, the connector 21 can be reliably mounted even in the structure in which the transmission line 60 includes the hollow portion 14A.

Further, in this configuration, the columnar body is realized by the structure in which the ground conductor 17A is connected to the ground conductor 17C. Thus, a shape of the terminal portion of the transmission line 60 can be made smaller, compared to a case where a columnar body only for supporting the connector 21 is separately formed. In addition, by using the ground conductor 17A and the ground conductor 17C each having a larger area than that of other conductor as a portion of the columnar body, strength of the columnar body can be increased, which is more preferable.

Note that, in the above description, the mounting electrode 22, the mounting auxiliary electrode 22A, and the internal electrode 24 are disposed at a center of the region Re22 surrounded by the four columnar bodies. However, the mounting electrode 22, the mounting auxiliary electrode 22A, and the internal electrode 24 are preferably included in the region Re22, and it is sufficient that at least a portion of the mounting electrode 22, the mounting auxiliary electrode 22A, and the internal electrode 24 is included in the region Re22.

In addition, in the above description, the region Re22 is a rectangle, but is not limited to the rectangle, and it is sufficient that the region Re22 is formed in a polygon of a triangle or above-described shapes.

In addition, in the above-described configuration, it is preferable that a melting point of solder forming the solder bump 170 have the following relationship with a melting point of the metal joining material and a melting point of the interlayer connection conductor.

(melting point of solder)<(melting point of the metal joining material)<(melting point of the interlayer connection conductor)

According to this relationship, remelting of the interlayer connection conductor can be reduced or prevented at the time of joining using the metal joining material, and remelting of the metal joining material and the interlayer connection conductor can be reduced or prevented at the time of joining using solder.

In addition, in each of the above-described preferred embodiments, a protection film may be patterned on the joining electrode in order to easily fix a position of the metal joining material.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line, comprising:
a first structure including a first resin base material having flexibility, and a first ground conductor on the first resin base material;
a second structure including a second resin base material having flexibility, and a first signal line and an interlayer connection conductor in or on the second resin base material;
a first spacer between the first structure and the second structure; and
a first metal joining material to join the first structure and the second structure with the first spacer interposed therebetween; wherein
a first hollow portion is between the first structure and the second structure joined to each other with the first spacer interposed therebetween;
the first signal line and the first ground conductor face each other in a joining direction with the first hollow portion interposed therebetween;
the first resin base material and the second resin base material are not in contact with each other.

2. A transmission line, comprising:
a first structure including a first resin base material having flexibility, and a first ground conductor on the first resin base material;
a second structure including a second resin base material having flexibility, and a first signal line and an interlayer connection conductor in or on the second resin base material;
a first spacer between the first structure and the second structure; and
a first metal joining material to join the first structure and the second structure with the first spacer interposed therebetween; wherein
a first hollow portion is between the first structure and the second structure joined to each other with the first spacer interposed therebetween;
the first signal line and the first ground conductor face each other in a joining direction with the first hollow portion interposed therebetween; and
the first metal joining material has a melting point lower than a melting point of the interlayer connection conductor.

3. The transmission line according to claim 1, wherein the second structure includes a second ground conductor in or on the second resin base material.

4. The transmission line according to claim 1, wherein the first resin base material and the second resin base material are a same kind.

5. The transmission line according to claim 1, wherein the first resin base material and the second resin base material have characteristics different from each other.

6. The transmission line according to claim 2, further comprising:
a third structure including a third resin base material having flexibility, and a third ground conductor on the third resin base material;
a second spacer between the second structure and the third structure; and
a second metal joining material to join the second structure and the third structure in the joining direction with the second spacer interposed therebetween; wherein
a second hollow portion is defined by the second structure and the third structure being joined to each other with the second spacer interposed therebetween;
the first signal line and the third ground conductor face each other in the joining direction with the second hollow portion interposed therebetween;
the second resin base material and the third resin base material are not in contact with each other; and
the second metal joining material has a melting point lower than the melting point of the interlayer connection conductor.

7. The transmission line according to claim 6, wherein the second resin base material and the third resin base material are a same kind.

8. The transmission line according to claim 6, wherein a Young's modulus of the first resin base material and a Young's modulus of the third resin base material are higher than a Young's modulus of the second resin base material.

9. The transmission line according to claim 6, wherein a coefficient of linear expansion of the first resin base material and a coefficient of linear expansion of the third resin base material are larger than a coefficient of linear expansion of the second resin base material.

10. The transmission line according to claim 6, wherein the second resin base material and the third resin base material have characteristics different from each other.

11. The transmission line according to claim 1, wherein the first spacer includes a conductor made of a same material as a material of a conductor of the first signal line.

12. The transmission line according to claim 1, wherein the first spacer includes a conductor thicker than a conductor of the first signal line.

13. The transmission line according to claim 1, wherein the first signal line and the first ground conductor face each other with the first hollow portion and a resin base material interposed therebetween.

14. The transmission line according to claim 1, wherein a portion in which a thickness of the second resin base material is reduced in the joining direction is included at a position where the first signal line faces the first ground conductor, such that a ratio of a resin portion positioned between the first signal line and the first ground conductor is reduced.

15. The transmission line according to claim 2, wherein the first structure includes:
   a mounting electrode connected to the first signal line; and
   ground mounting electrodes connected to the first ground conductor or via the first ground conductor;
   columnar bodies including conductors are in or on the first structure and the second structure, and have a shape extending in a thickness direction of the transmission line;
   each of the columnar bodies overlaps with a corresponding one of the ground mounting electrodes in plan view; and
   in the plan view, the mounting electrode is disposed in a region surrounded by the ground mounting electrodes.

16. The transmission line according to claim 15, wherein a melting point of a conductive joining material on the mounting electrode and the ground mounting electrodes is lower than the melting point of the first metal joining material and the melting point of the interlayer connection conductor.

17. The transmission line according to claim 1, wherein the first ground conductor is provided with slits; and
   connection regions are defined by the slits.

18. The transmission line according to claim 16, wherein the first spacer is divided into small spacers; and
   the connection regions overlap with the small spacers, when viewed in a top-bottom direction.

19. The transmission line according to claim 2, further comprising metal balls including a melting point higher than the melting point of the interlayer connection conductor, provided in the first metal joining material, and having a uniform size.

20. The transmission line according to claim 1, further comprising protection films to cover a surface of the first resin base material and a surface of the second resin base material, the surfaces facing each other.

21. The transmission line according to claim 1, wherein the second structure further includes a second signal line in or on the second resin base material.

22. The transmission line according to claim 1, further comprising a connector mounted on one of two surfaces included in a transmission line spaced away from the first hollow portion.

23. The transmission line according to claim 1, wherein the first metal joining material has a rectangular shape having a long side extending in an extending direction of the first signal line.

24. An electronic apparatus comprising the transmission line according to claim 1.

25. An electronic apparatus comprising the transmission line according to claim 2.

26. A method of manufacturing a transmission line, the method comprising:
   forming a first structure by forming a first ground conductor on a first resin base material having flexibility;
   forming a second structure by forming a first signal line and an interlayer connection conductor in or on a second resin base material having flexibility; and
   joining the first structure and the second structure by a metal joining material with a spacer interposed therebetween such that the first signal line and the first ground conductor face each other with a hollow portion interposed therebetween; wherein
   in the joining the first structure and the second structure, the first resin base material and the second resin base material are not in contact with each other; and
   the metal joining material has a melting point lower than a melting point of the interlayer connection conductor.

27. The method of manufacturing a transmission line according to claim 26, wherein the joining the first structure and the second structure is performed while the first structure and the second structure are affixed to each other.

* * * * *